(12) United States Patent
Luo et al.

(10) Patent No.: US 9,012,965 B2
(45) Date of Patent: Apr. 21, 2015

(54) SEMICONDUCTOR DEVICE AND MANUFACTURING METHOD THEREOF

(75) Inventors: Jun Luo, Beijing (CN); Chao Zhao, Kessel-Lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 135 days.

(21) Appl. No.: 13/379,120

(22) PCT Filed: Apr. 22, 2011

(86) PCT No.: PCT/CN2011/000712
§ 371 (c)(1),
(2), (4) Date: Dec. 19, 2011

(87) PCT Pub. No.: WO2012/094784
PCT Pub. Date: Jul. 19, 2012

(65) Prior Publication Data
US 2012/0181586 A1    Jul. 19, 2012

(30) Foreign Application Priority Data
Jan. 13, 2011   (CN) .......................... 2011 1 0006429

(51) Int. Cl.
*H01L 29/76* (2006.01)
*H01L 29/47* (2006.01)
(Continued)

(52) U.S. Cl.
CPC .......... *H01L 29/47* (2013.01); *H01L 29/66545* (2013.01); *H01L 29/66643* (2013.01); *H01L 29/7839* (2013.01); *H01L 21/28518* (2013.01); *H01L 21/26506* (2013.01)

(58) Field of Classification Search
USPC ................... 257/66, E29.003, E21.411, 288, 257/E29.255, 315, E21.409; 438/303, 149, 438/549, 276, 291, 585, 197–199, 217, 438/229–232, 211, 151
See application file for complete search history.

(56) References Cited

U.S. PATENT DOCUMENTS 5,719,081 A * 2/1998 Racanelli et al. ............. 438/290
6,365,450 B1   4/2002 Kim
(Continued)

FOREIGN PATENT DOCUMENTS

| CN | 101207158 A | 6/2008 |
|---|---|---|
| CN | 101685800 A | 3/2010 |
| CN | 101847582 A | 9/2010 |

OTHER PUBLICATIONS

International Search Report PCT/CN2011/000712.

*Primary Examiner* — Mohammad Islam
*Assistant Examiner* — Ankush Singal
(74) *Attorney, Agent, or Firm* — Troutman Sanders LLP

(57) ABSTRACT

The invention discloses a novel MOSFET device fabricated by a gate last process and its implementation method, the device comprising: a substrate; a gate stack structure located on a channel region in the substrate, on either side of which is eliminated the conventional isolation spacer; an epitaxially grown ultrathin metal silicide constituting a source/drain region. Wherein the device eliminates the high resistance region below the conventional isolation spacer; a dopant segregation region with imlanted ions is formed between the source/drain and the channel region, which decreases the Schottky barrier height between the metal silicide source/drain and the channel. At the same time, the epitaxially grown metal silicide can withstand a second high-temperature annealing used for improving the performance of a high-k gate dielectric material, which further improves the performance of the device. The MOSFET according to the invention reduces the parasitic resistance and capacitance greatly and thereby decreases the RC delay, thus improving the switching performance of the MOSFET device significantly.

13 Claims, 3 Drawing Sheets

(51) Int. Cl.
*H01L 29/66* (2006.01)
*H01L 29/78* (2006.01)
*H01L 21/285* (2006.01)
*H01L 21/265* (2006.01)

(56) References Cited

U.S. PATENT DOCUMENTS

| | | | | |
|---|---|---|---|---|
| 6,645,818 | B1* | 11/2003 | Sing et al. | 438/275 |
| 6,657,244 | B1* | 12/2003 | Dokumaci et al. | 257/288 |
| 7,091,093 | B1* | 8/2006 | Noda et al. | 438/276 |
| 7,098,120 | B2 | 8/2006 | Saito | |
| 7,253,049 | B2* | 8/2007 | Lu et al. | 438/231 |
| 7,812,370 | B2* | 10/2010 | Bhuwalka et al. | 257/192 |
| 2005/0139860 | A1 | 6/2005 | Snyder et al. | 257/155 |
| 2005/0272191 | A1* | 12/2005 | Shah et al. | 438/197 |
| 2006/0046523 | A1* | 3/2006 | Kavalieros et al. | 438/791 |
| 2006/0065939 | A1* | 3/2006 | Doczy et al. | 257/412 |
| 2006/0091490 | A1* | 5/2006 | Chen et al. | 257/458 |
| 2007/0111435 | A1* | 5/2007 | Kim et al. | 438/253 |
| 2007/0138536 | A1* | 6/2007 | Arai et al. | 257/315 |
| 2008/0283839 | A1* | 11/2008 | Watanabe et al. | 257/66 |
| 2009/0087974 | A1* | 4/2009 | Waite et al. | 438/592 |
| 2009/0152652 | A1* | 6/2009 | Nishi et al. | 257/412 |
| 2010/0207208 | A1* | 8/2010 | Bedell et al. | 257/346 |
| 2011/0169105 | A1* | 7/2011 | Okubo | 257/411 |
| 2011/0241115 | A1* | 10/2011 | Lavoie et al. | 257/347 |
| 2011/0248343 | A1* | 10/2011 | Guo et al. | 257/347 |
| 2011/0260252 | A1* | 10/2011 | Khater et al. | 257/351 |
| 2012/0007051 | A1* | 1/2012 | Bangsaruntip et al. | 257/24 |
| 2012/0007181 | A1* | 1/2012 | Cai et al. | 257/347 |
| 2012/0037991 | A1* | 2/2012 | Guo et al. | 257/347 |
| 2012/0043614 | A1* | 2/2012 | Choi et al. | 257/369 |
| 2012/0088345 | A1* | 4/2012 | Chen et al. | 438/301 |
| 2012/0139047 | A1* | 6/2012 | Luo et al. | 257/347 |
| 2012/0181586 | A1* | 7/2012 | Luo et al. | 257/288 |
| 2012/0267706 | A1* | 10/2012 | Luo et al. | 257/329 |
| 2012/0326125 | A1* | 12/2012 | Guo et al. | 257/24 |

* cited by examiner

SEMICONDUCTOR DEVICE AND MANUFACTURING METHOD THEREOF

This application is a National Phase application of, and claims priority to, PCT Application No. PCT/CN2011/000712, filed on Apr. 22, 2011, entitled "Semiconductor device and manufacturing method thereof", which claimed priority to Chinese Application No. 201110006429.8 filed on Jan. 13, 2011. Both the PCT Application and Chinese Application are incorporated herein by reference in their entireties.

FIELD OF THE INVENTION

The invention relates to a semiconductor device and a manufacturing method thereof, and in particular, to a new semiconductor device structure suitable for the gate last process which has an ultrathin metal silicide source/drain and a manufacturing method thereof.

BACKGROUND OF THE INVENTION

The continuous increase of IC integration level requires the size of a device to be continuously scaled down. However, sometimes the operation voltage of an electrical appliance remains constant, which results in a continuous increase of the electric field strength inside a practical MOS device. High electric field causes a series of reliability problems, and leads to degradation in performance of the device.

The parasitic series resistance between the source/drain regions of an MOSFET will lead to the reduction of the equivalent operating voltage. In order to decrease the contact resistivity as well as the source-drain series resistance, a deep submicron small sized MOSFET usually employs a silicide as the dopant source technique (SADS), i.e., usually employs a metal silicide in direct contact with a channel as the source/drain of the MOSFET. Such a metal silicide source/drain MOSFET is also referred to as a Schottky barrier source/drain MOSFET. As shown in FIG. 1, a substrate 10 is divided by a shallow trench isolation (STI) 20 into a plurality of active regions with a channel region 14 included therein, a gate structure 40 and a cover layer 50 on top of it are formed on the substrate 10, isolation spacers 60 are formed on opposite sides of the gate structure 40, a metal silicide source/drain region 30 is formed in the substrate 10 on one side of each of the spacers 60, and the source/drain region 30 is in direct contact with the channel region 14. Wherein the substrate 10 may be a bulk silicon, or may also be a silicon-on-insulator (SOI) comprising a silicon substrate 11, a buried oxide layer 12 and a thin silicon layer 13, or may further be a compound semiconductor material such as SiGe, etc. As compared to a conventional MOSFET with a highly doped source/drain, such a Schottky bather source/drain MOSFET does not need ion shot into source/drain and subsequent activation, the process is simpler, the contact resistance is smaller, and the electrical performance is superior.

It should be noted that, in FIG. 1 and the subsequent Figs., for the sake of convenience to indicate, the STI 20 between the bulk silicon substrate 10 and the SOI substrate (11, 12 and 13) is just a schematic isolation, and not a real adjacency or contact.

The driving capability of the metal silicide source/drain MOSFET is controlled by the Schottky barrier height (SBH) between its source and channel. As the SBH decreases, the driving current increases. Results of a device simulation show that when the SBH decreases to about 0.1 eV, the metal silicide source/drain MOSFET will achieve the same driving capability as the conventional MOSFET with highly doped source/drain.

As shown in FIG. 2, it is a schematic view of a method to use the silicide as the dopant source technique (SADS) to decrease the SBH. Firstly, as shown in FIG. 2A, ions such as boron (B), arsenic (As) and the like are shot into a silicide film 30; next, as shown in FIG. 2B, annealing is performed at 500 to 850° C. to cause ions to segregate at the silicide/silicon interface (i.e., the interface between the source/drain region 30 and the thin silicon layer 13/channel region 14), forming an activated dopant segregation region 70, as shown by the dopant segregation region 70 represented by the hatched part. The dopant segregation region 70 leads to the decrease of the SBH between the source and the channel, thereby improving the driving capability of the device; at the same time, the damage to the silicide film induced by ion implantation is also completely or partly repaired due to the annealing. Since it is necessary to anneal at a high temperature to cause the doped ions to segregate, such an SADS technique requires that the silicide film (the metal silicide source/drain 30) can withstand a high temperature annealing without degradation (agglomeration), namely, the silicide film needs to possess enough thermal stability.

However, after a continuous downscaling of the MOSFET, the thermal stability of the originally relatively thick metal silicide source/drain film 30 will become poor. After a reduction in size, the channel 14 becomes short, and the metal silicide source/drain film 30 will also have to become thin accordingly in order to better control the short channel effect, but the thinned silicide film 30 shows a poor thermal stability during the annealing, and is easy to agglomerate, resulting in a drastic increase in resistivity. Since in the above mentioned SADS method for decreasing the SBH, the silicide film cannot withstand the high temperature needed to give rise to dopant segregation at the silicide/silicon interface, it is impossible for the current metal silicide source/drain MOSFET to effectively decrease the SBH.

Furthermore, when a gate oxide layer continues to be thinned as the downscaling of the MOSFET, the accompanying tremendous electric field strength will cause the breakdown of the oxide layer, forming a leakage path through the gate oxide layer and destructing the insulation of the gate dielectric layer. For reducing the leakage of the gate, a high-k gate dielectric material instead of $SiO_2$ is employed as the gate dielectrics. However, the high-k dielectrics is incompatible with the poly-silicon gate process, and therefore the gate is often made of a metal material.

Illustrated in FIG. 3 is a schematic drawing of the "gate last" process employed in forming such a structure with the high-k gate dielectric material and the metal gate currently. Over a channel region of a substrate 10 with a shallow trench isolation (STI) 20 is formed a dummy gate structure (not shown), around the dummy gate structure is formed an isolation spacer 60, on side of the isolation spacer 60 is formed a metal silicide source/drain region 30, on the whole structure is covered with an interlayer dielectric layer 80, the dummy gate structure is removed, in openings left in the interlayer dielectric layer 80 are sequentially filled with a high-k gate dielectric material 41 and a metal gate 40 to form the final gate structure (A dummy gate is first deposited, and then a metal gate is formed, therefore such a process is referred to as the gate last process, wherein usually after depositing the high-k gate dielectric material, a high temperature annealing is also performed to eliminate defects between high-k gate dielectric material and the channel), etching is performed at a position in the interlayer dielectric layer 80 corresponding to the source/drain region 30 to form a contact hole, and in the contact hole is deposited a metal contact part 90. In such a device structure, there is a spacing between the contact hole and the isolation spacer, and there is a distance between the metal silicide source/drain 30 and the gate structure, i.e., there is neither a metal silicide nor an extended region of the highly doped source/drain below the isolation spacer 60, which will cause a significant and unbearable source/drain parasitic resistance. Such a parasitic resistance and capacitance in the MOSFET structure will increase the RC delay of the device, reduce the switching speed of the device, and thereby greatly affect the performance of such a metal silicide source/drain MOSFET. Consequently, reduction of the parasitic resistance and the parasitic capacitance between the gate and the source/drain is critical to decrease the RC delay.

In addition, since in the SADS technique the metal silicide source/drain region 30 is formed before the high temperature annealing (not only the high temperature annealing for causing dopant segregation, but also the annealing for eliminating the defects between high-k dielectric material and channel), the integrality of the metal silicide source/drain 30 will be deteriorated during the high temperature annealing, i.e., agglomeration may occur for the metal silicide film. The poor thermal stability of silicide will make it impossible to use the SADS technique to decrease the SBH.

In summary, the metal silicide source/drain MOSFET manufactured by gate last process is regarded as the next generation sub-20 nm CMOS structure. The prior SADS method for decreasing the SBH between the source and the channel region to improve the driving capability may not be implemented for being unable to withstand the high temperature annealing when the channel is shortened and the metal silicide film is fairly thin. Furthermore, it is an important point that in a conventional device, below the isolation spacer there is neither a metal silicide nor an extension of the highly doped source/drain region, and thus leading to significant source/drain parasitic resistance and capacitance, which unfortunately increases the RC delay time of the device, and reduces the switching speed of the device.

SUMMARY OF THE INVENTION

Accordingly, an object of the invention is to overcome at least one of the above mentioned disadvantages and provide an improved semiconductor device and a manufacturing method therefore.

This invention provides a semiconductor device comprising a substrate, a channel region located in the substrate, source/drain regions located on opposite sides of the channel region, and a gate structure located on the channel region, characterized in that, the source/drain regions are constituted by epitaxially grown metal silicide.

Wherein, a dopant segregation region is formed between the metal silicide source/drain region and the channel region, the interface between the dopant segregation region and the channel region is parallel to the side of the gate structure; for a p-type metal silicide source/drain MOSFET, the ion for dopant segregation is any one or combination of boron, aluminium, gallium, indium, and for an n-type metal silicide source/drain MOSFET, the ion for dopant segregation is any one or combination of nitrogen, phosphor, arsenic, oxygen, sulfur, selenium, tellurium, fluorine, chlorine.

Wherein, the thickness of the epitaxially grown metal silicide is less than or equal to 15 nm, and the material of the epitaxially grown metal silicide is $NiSi_{2-y}$, $Ni_{1-x}Pt_xSi_{2-y}$, $CoSi_{2-y}$ or $Ni_{1-x}Co_xSi_{2-y}$, wherein $0<x<1$, and $0\leq y<1$.

The device further comprises an interlayer dielectric layer and a metal contact structure, the interlayer dielectric layer being located on the epitaxially grown metal silicide and around the gate structure and in direct contact with the gate structure, the metal contact structure being located in the interlayer dielectric layer and electrically connected to the epitaxially grown metal silicide, the metal contact structure comprising a contact hole buried layer and a filling metal layer.

Further, the invention provides a method for manufacturing a semiconductor device, which comprises: forming a dummy gate structure on a substrate; depositing a metal layer covering the substrate and the dummy gate structure; performing a first annealing to cause the metal layer on opposite sides of the dummy gate structure to react with the substrate to form epitaxially grown metal silicide; stripping off the un-reacted metal layer, then the epitaxially grown metal silicide forming source/drain regions of the device, the substrate below the dummy gate structure forming a channel region, and the metal silicide source/drain regions being in direct contact with the channel region; implanting ions into the as-formed epitaxially grown metal silicide source/drain regions; and performing a second annealing, forming a dopant segregation region with implanted ions at the interface between the epitaxially grown metal silicide source/drain region and the channel region.

Wherein, the material of the epitaxially grown metal silicide is $NiSi_{2-y}$, $Ni_{1-x}Pt_xSi_{2-y}$, $CoSi_{2-y}$ or $Ni_{1-x}Co_xSi_{2-y}$, wherein $0<x<1$, and $0\leq y<1$.

Wherein, the dosage for ion implantation into the as-formed epitaxially grown metal silicide source/drain regions is $1\times10^{14}$ $cm^{-2}$ to $1\times10^{16}$ $cm^{-2}$; for a p-type metal silicide source/drain MOSFET, the implanted ion is any one or combination of boron, aluminium, gallium, indium, and for an n-type metal silicide source/drain MOSFET, the implanted ion is any one or combination of nitrogen, phosphor, arsenic, oxygen, sulfur, selenium, tellurium, fluorine, chlorine.

Wherein, the temperature of the first annealing and/or the second annealing is 500 to 850° C.

Wherein, the thickness of the metal layer is less than or equal to 5 nm, and the material of the metal layer comprises cobalt, nickel, nickel-platinum alloy, nickel-cobalt alloy or ternary alloy of nickel, platinum and cobalt.

Wherein, the dummy gate structure is constituted by silicon dioxide.

The method for manufacturing a semiconductor device further comprises: before performing the second annealing, forming an interlayer dielectric layer on the epitaxially grown metal silicide source/drains and around the dummy gate structure, removing the dummy gate structure, and depositing a high-k gate dielectric material. After the second annealing is performed, a metal gate material is deposited, which together with the high-k gate dielectric material constitute a gate stack structure. After the metal gate material is deposited, a metal contact structure is formed in the interlayer dielectric layer, the metal contact structure being electrically connected to the epitaxially grown metal silicide. Wherein the metal contact structure comprises a contact hole buried layer and a filling metal layer. Wherein the hydrofluoric acid wet etching is used for removing the dummy gate structure.

In a novel MOSFET manufactured according to the invention, there is no need to form an isolation spacer around the gate stack structure, thereby greatly reducing the parasitic capacitance between the gate and the source/drain, and the MOSFET eliminates the high resistance region below the conventional isolation spacer, thereby reducing parasitic resistance. The reduced parasitic resistance and capacitance greatly decrease the RC delay, thus significantly improving the switch performance of the MOSFET device. Furthermore, due to appropriate selection of the thickness of the thin metal layer and the first annealing temperature, the epitaxially grown ultrathin metal silicide has good thermal stability and can withstand the second high-temperature annealing used for improving the performance of the high-k gate dielectric material, which further improves the performance of the device.

BRIEF DESCRIPTION OF THE DRAWINGS

In the following the technical solutions of the invention will be described in detail with reference to the accompanying drawings, in which.

DETAILED DESCRIPTION OF THE INVENTION

Figure 1:
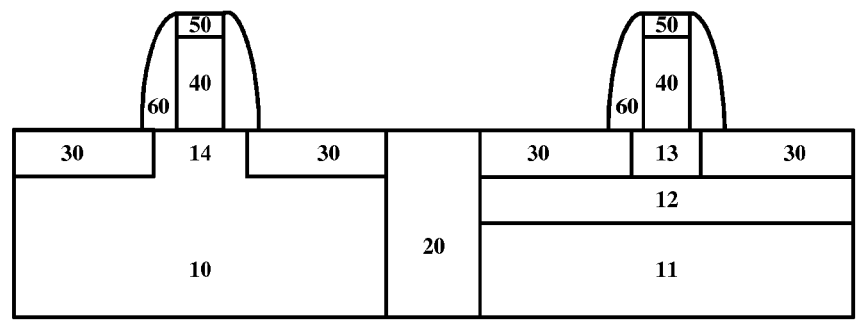
FIG. 1 shows a schematic cross section view of a metal silicide source/drain MOSFET fabricated by employing the prior art.
Figures 2A, 2B:
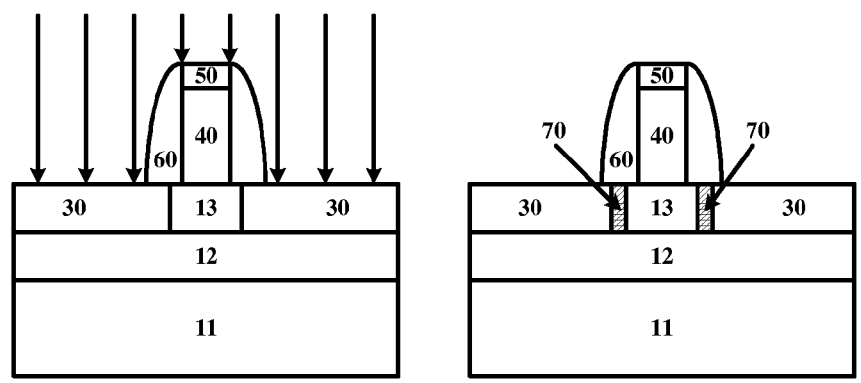
FIG. 2 shows a schematic cross section view of employing the SADS technique to form dopant segregation region.
Figure 3:
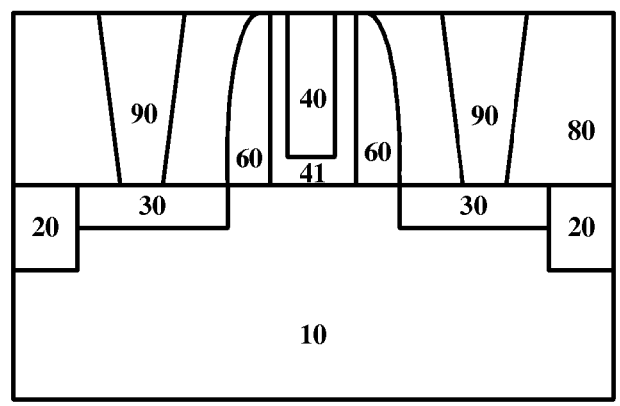
FIG. 3 shows a schematic cross section view of a metal silicide source/drain MOSFET fabricated by employing the prior gate last process technique.

In the following, the features and technical effects thereof of the technical solutions of the invention will be described in detail with reference to the accompanying drawings and in connection with exemplary embodiments of the invention. A novel semiconductor device structure and its manufacturing method is disclosed, which can effectively reduce the parasitic source-drain series resistance in a metal silicide source/drain MOSFET fabricated by the gate last process as well as the parasitic capacitance between the gate and the source/drain. It should be noted that like reference numerals denote like structures, and the terms "first", "second", "above", "below" and so on as used in this application can be used for describing various device structures. Such description does not suggest spatial, sequential or hierarchical relationship among the described device structures, unless specifically stated.

Figure 4:
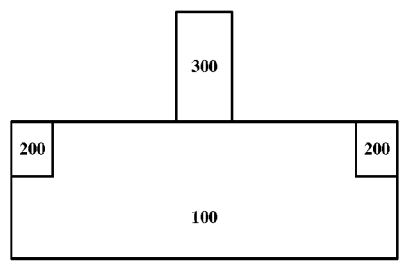
FIGS. 4-12 show schematic cross section views of individual steps in fabricating a metal silicide source/drain MOSFET according to the invention.

Firstly, a basic structure with a dummy gate is formed. As shown in FIG. 4, a schematic cross section view of the basic structure is shown. A pad oxide layer (not shown) is deposited on a substrate 100 with a shallow trench isolation (STI) 200, wherein the substrate 100 can be a bulk silicon, a silicon-on-insulator (SOI), or other compound semiconductor substrate containing silicon, e.g., SiGe, SiC, etc., and a combination of these; the pad oxide layer is silicon oxide, for example, particularly silicon dioxide ($SiO_2$). A dummy gate layer 300 is deposited on the pad oxide layer, and the material of the dummy gate layer 300 is oxide, for example, silicon dioxide. A cover layer (not shown) is deposited on the dummy gate layer 300, whose material is usually nitride, for example, silicon nitride (SiN), and is used as a mask layer for etching to be performed later. A commonly used photolithography mask etching process is employed to form a dummy gate stack structure constituted by stacking the pad oxide layer, the dummy gate layer 300 and the cover layer. At this point, neither performs an ion implantation, nor activates the ions by annealing.

Figure 5:
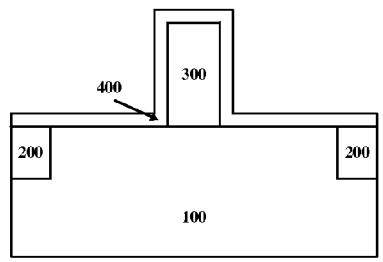

Secondly, a thin metal layer is deposited. As shown in FIG. 5, on the entire structure, i.e., on the substrate 100, the STI 200, and the dummy gate stack structure is deposited the thin metal layer 400 for forming an epitaxially grown ultrathin metal silicide. The thin metal layer 400 may be cobalt (Co), nickel (Ni), nickel-platinum alloy (Ni—Pt, wherein the content of Pt is less than or equal to 8%), or nickel-cobalt alloy (Ni—Co, wherein the content of Co is less than or equal to 10%), or ternary alloy of nickel, platinum and cobalt, and its thickness can be less than 5 nm, preferably less than or equal to 4 nm. In particular, the thin metal layer 400 can be Co with the thickness less than 5 nm, Ni with the thickness less than or equal to 4 nm, Ni—Pt with the thickness less than or equal to 4 nm, or Ni—Co with the thickness less than or equal to 4 nm.

Figure 6:
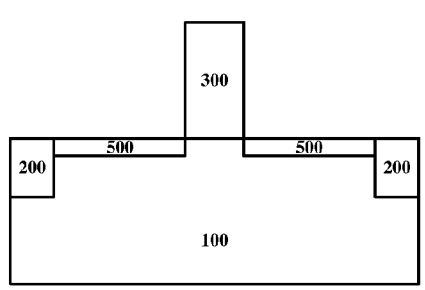

Next, the epitaxially grown ultrathin metal silicide is formed by annealing and the un-reacted thin metal layer is stripped off. As shown in FIG. 6, a first annealing is performed at 500 to 850° C., wherein the deposited thin metal layer 400 is reacted with the silicon in the substrate 100, which results in the formation of epitaxially grown ultrathin metal silicide. Un-reacted thin metal layer 400 is then stripped off, leaving the epitaxially grown ultrathin metal silicide 500 on opposite sides of the dummy gate structure on the substrate 100, which constitutes the metal silicide source/drain region. As can be seen from the figure, the ultrathin metal silicide 500 is directly in contact with the channel region below the dummy gate stack structure. In particular, namely, the interface between the metal silicide 500 and the channel region is parallel to, preferably coplanar with the side of the dummy gate stack structure. Depending on the material of the thin metal layer 400, the epitaxially grown ultrathin metal silicide 500 can correspondingly be $NiSi_{2-y}$, $Ni_{1-x}Pt_xSi_{2-y}$, $CoSi_{2-y}$, or $Ni_{1-x}Co_xSi_{2-y}$, wherein x is greater than 0 and less than 1, and y is greater than or equal to 0 and less than 1. The thickness of the epitaxially grown ultrathin metal silicide 500 is 1 to 15 nm.

It should be noted that the first annealing of a high temperature performed in the formation of epitaxial growth of the ultrathin metal silicide 500, in addition to facilitating the reaction of the thin metal layer 400 with Si in the substrate 100, eliminates the extrinsic surface states arising from the defects in the surface layer of the substrate 100, thereby suppressing the so-called "piping effect" which usually occurs during a self-aligned nickel-based silicide (SALICIDE) process. In addition, since the material and thickness of the thin metal layer 400 are appropriately controlled, and the first annealing of a high temperature is employed, the resulting epitaxially grown ultrathin metal silicide 500 can withstand the second high-temperature annealing in a subsequent process used for improving the performance of the high-k gate dielectric.

Figure 7:
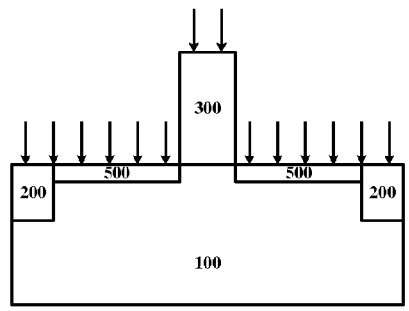

Then, ions are implanted into the resulting epitaxially grown ultrathin metal silicide source/drain region. As shown in FIG. 7, ions are implanted into the epitaxially grown ultrathin metal silicide source/drain 500, and the dosage is $1\times10^{14}$ $cm^{-2}$ to $1\times10^{16}$ $cm^{-2}$; for a p-type epitaxially grown ultrathin metal silicide source/drain MOSFET, the implanted ion can be boron (B), aluminium (Al), gallium (Ga), indium (In), etc., or a combination thereof, and for an n-type epitaxially grown ultrathin metal silicide source/drain MOSFET, the implanted ion can be nitrogen (N), phosphor (P), arsenic (As), oxygen (O), sulfur (S), selenium (Se), tellurium (Te), fluorine (F), chlorine (Cl), etc., or a combination thereof. The ion implantation process will damage the epitaxially grown ultrathin metal silicide source/drain, so the implantation energy should not be too large. The implantation energy had better be low enough to ensure that most implanted ions are confined within the epitaxially grown ultrathin silicide source/drain.

Figure 8:
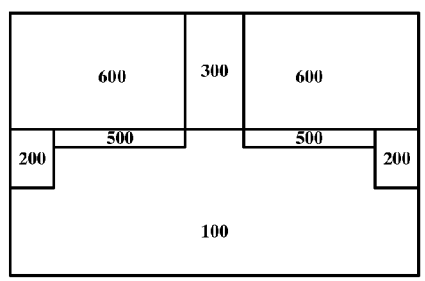

Next, an interlayer dielectric layer is deposited and planarized. As shown in FIG. 8, a commonly used process is employed to deposit a thick dielectric material layer, whose material is preferably nitride, e.g., silicon nitride. A chemical mechanical polishing (CMP) is employed to planarize the dielectric material layer, until the dummy gate layer 300 is exposed, and finally the interlayer dielectric layer 600 is formed.

Figure 9:
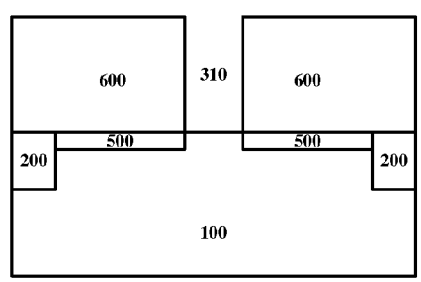

Subsequently, the dummy gate layer 300 and the pad oxide layer are removed. As shown in FIG. 9, a commonly used wet etching process is employed to remove the dummy gate layer 300 and the pad oxide layer, leaving a gate hole 310 in the interlayer dielectric layer 600. An HF etching liquid with concentration of 5% can be employed when the materials of the pad oxide layer and the dummy gate layer 300 are silicon dioxide.

Figure 10:
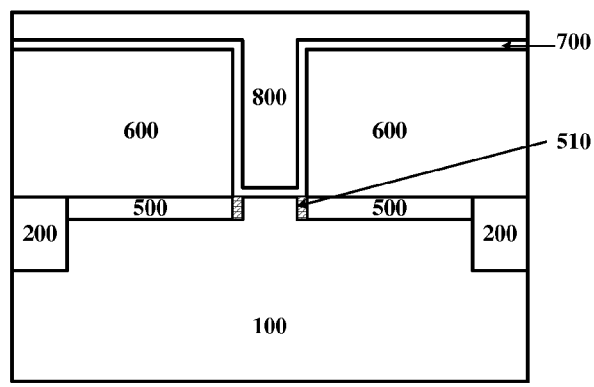

Then, a gate stack structure and a dopant segregation region with implanted ions are formed. As shown in FIG. 10, a high-k gate dielectric material layer 700 is deposited in the gate hole 310 and on the interlayer dielectric layer 600, and a second annealing is performed at 500 to 850° C., to repair the defects in the high-k gate dielectric material and thus to improve reliability. It should be noted that the second annealing not only repairs the defects in the high-k gate dielectric material, but also drives the implanted ions within the epitaxially grown ultrathin metal silicide source/drain 500 to the silicide/silicon interface, thereby forming the dopant segregation region 510 with implanted ions, wherein the interface between the dopant segregation region 510 and the channel region is parallel to the side of the gate stack structure. In particular, the interface between the dopant segregation region 510 with implanted ions and the channel region in the substrate 100 is parallel to, preferably coplanar with the interface between the high-k gate dielectric material layer 700 and the interlayer dielectric layer 600; or the interface between the dopant segregation region 510 with implanted ions and the channel region in the substrate 100 can be parallel to, preferably coplanar with the interface between the high-k gate dielectric material layer 700 and a gate metal layer 800 to be formed. After the second high temperature annealing, the gate metal layer 800 is deposited on the high-k gate dielectric material layer 700. The high-k gate dielectric material layer 700 and the gate metal layer 800 constitutes the gate stack structure, wherein the high-k gate dielectric material layer 700 is not only located below the gate metal layer 800, but also located around the side thereof.

Figure 11:
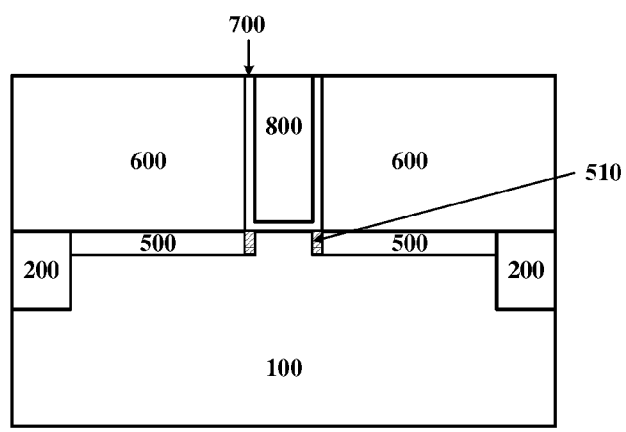

Next, the gate stack structure is planarized. As shown in FIG. 11, CMP is employed to planarize the gate stack structure, until the interlayer dielectric layer 600 is exposed.

Figure 12:
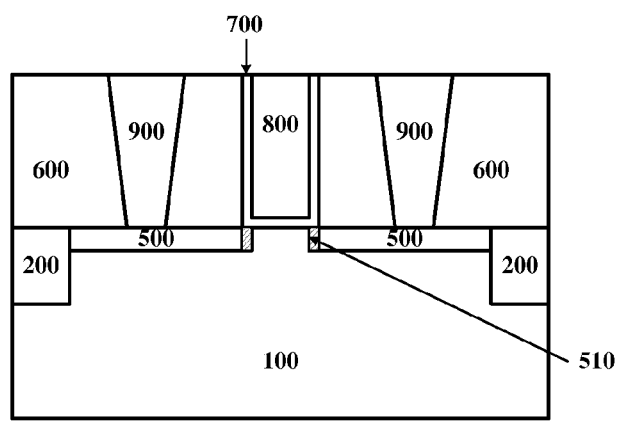

Finally, a source/drain contact hole is formed. As shown in FIG. 12, a photolithography is performed in the interlayer dielectric layer 600, and after etching, a contact hole extending to the epitaxially grown ultrathin metal silicide 500 is formed. In the contact hole and on the interlayer dielectric layer 600 are sequentially filled up a thin contact hole buried layer (not shown) and a thick filling metal layer 900, and the filling metal layer 900 is planarized by CMP, until the interlayer dielectric layer 600 and the gate metal layer 800 are exposed. The material of the contact hole buried layer can be TiN, Ti, TaN or Ta and a combination thereof, whose function is to enhance the adhesive force between the filling metal layer 900 and the epitaxially grown ultrathin metal silicide 500 and to block impurities' diffusion. The material of the filling metal layer 900 can be W, Cu, TiAl or Al and a combination thereof. The material is selected according to the requirement of the overall circuit wiring layout, and preferably, a material with a good conductive performance is selected.

A novel metal silicide source/drain MOSFET device structure formed by the manufacturing method described above according to the invention is shown in FIG. 12. There are shallow trench isolations (STI) 200 in the substrate 100; the epitaxially grown ultrathin metal silicide source/drain regions 500 are formed in the active region between the STIs 200 in the substrate 100; the gate stack structure formed on the substrate 100 is located in between the source/drain regions 500, the gate stack structure comprising the high-k gate dielectric material layer 700 and the gate metal layer 800, wherein the high-k gate dielectric material layer 700 is located not only below the gate metal layer 800, but also around the side thereof; the dopant segregation region 510 with implanted ions is formed between the epitaxially grown ultrathin metal silicide source/drain region 500 and the channel region in the substrate 100, wherein the interface between the dopant segregation region 510 and the channel region is parallel to the side of the gate stack structure, in particular, the interface between the dopant segregation region 510 with implanted ions and the channel region in the substrate 100 is parallel to, preferably coplanar with the interface between the high-k gate dielectric material layer 700 and the interlayer dielectric layer 600; or the interface between the dopant segregation region 510 with implanted ions and the channel region in the substrate 100 can be parallel to, preferably coplanar with the interface between the high-k gate dielectric material layer 700 and the gate metal layer 800; the epitaxially grown ultrathin metal silicide 500 can be $NiSi_{2-y}$, $Ni_{1-x}Pt_xSi_{2-y}$, $CoSi_{2-y}$ or $Ni_{1-x}Co_xSi_{2-y}$, wherein x is greater than 0 and less than 1, and y is greater than or equal to 0 and less than 1; there is the interlayer dielectric layer 600 on the epitaxially grown ultrathin metal silicide 500 and around the gate stack structure, and the interlayer dielectric layer 600 is in direct contact with the high-k gate dielectric material layer 700; a metal contact structure passes through the interlayer dielectric layer 600, is electrically connected to the epitaxially grown ultrathin metal silicide 500, and comprises the contact hole buried layer and the filling metal layer 900, wherein the material of the contact hole buried layer can be TiN, Ti, TaN or Ta and a combination thereof, and the material of the filling metal layer 900 can be W, Cu, TiAl or Al and a combination thereof.

In the novel MOSFET fabricated according to the invention, the dopant segregation region with implanted ions is formed between the source/drain region and the channel, which can decrease the Schottky barrier height of the epitaxially grown ultrathin metal silicide source/drain MOSFET with a short channel. There is no need to form an isolation spacer around the gate stack structure, thereby greatly reducing the parasitic capacitance between the gate and the source/drain, and the large parasitic resistance region below a conventional isolation spacer is eliminated, thereby reducing the parasitic resistance. The reduced parasitic resistance and capacitance greatly reduce the RC delay, which improves the switch performance of the MOSFET device significantly. Furthermore, due to appropriate selection of the thickness of the thin metal layer and the first annealing temperature, the resulting epitaxially grown ultrathin metal silicide has good thermal stability and can withstand the second high-temperature annealing used for improving the performance of the high-k gate dielectric material, which further improves the performance of the device.

While the invention has been described with reference to one or more exemplary embodiment, it will be appreciated by the skilled in the art that various suitable modifications and the equivalent thereof can be made to the device structure without departing from the scope of the invention. Furthermore, from the disclosed teachings many modifications suitable for particular situations or materials can be made without departing from the scope of the invention. Therefore, the aim of the invention is not intended to be limited to the particular embodiments disclosed as the best implementations for implementing the invention, and the disclosed device structure and the manufacturing method thereof will comprise all the embodiments falling into the scope of the invention.

The invention claimed is:

1. A manufacturing method for fabricating a semiconductor device by a gate last process, comprising:
   forming a dummy gate structure on a substrate;
   depositing a metal layer covering the substrate and the dummy gate structure;
   performing a first annealing to cause the metal layer on opposite sides of the dummy gate structure to react with the substrate to form epitaxially grown metal silicide;
   stripping off the un-reacted metal layer, then the epitaxially grown metal silicide forming source/drain regions of the device, the substrate below the dummy gate structure forming a channel region, and the source/drain regions being in direct contact with the channel region;
   implanting ions into the epitaxially grown metal silicide source/drain regions;
   forming an interlayer dielectric layer on the epitaxially grown metal silicide and around the dummy gate structure;
   removing the dummy gate structure;
   depositing a high-k gate dielectric material in a gate trench in the interlayer dielectric layer formed after removing the dummy gate structure;
   performing a second annealing, forming a dopant segregation region with implanted ions at the interface between the epitaxially grown metal silicide source/drain region and the channel region; and
   depositing a metal gate material on the high-k gate dielectric material, the metal gate material and the high-k gate dielectric material constituting a gate stack structure,
   wherein the formation of an isolation spacer on either side of the dummy gate is avoided before the metal layer is deposited; and the semiconductor device has no isolation spacer on either side of the gate stack structure.

2. The manufacturing method for fabricating a semiconductor device as claimed in claim 1, wherein the epitaxially grown metal silicide is $NiSi_{2-y}$, $Ni_{1-x}Pt_xSi_{2-y}$, $CoSi_{2-y}$ or $Ni_{1-x}Co_xSi_{2-y}$, wherein $0<x<1$, and $0$ $y<1$.

3. The manufacturing method for fabricating a semiconductor device as claimed in claim 1, wherein for a p-type metal silicide source/drain MOSFET, the implanted ion is any one or combination of boron, aluminum, gallium, indium, and for an n-type metal silicide source/drain MOSFET, the implanted ion is any one or combination of nitrogen, phosphor, arsenic, oxygen, sulfur, selenium, tellurium, fluorine, chlorine.

4. The manufacturing method for fabricating a semiconductor device as claimed in claim 1, wherein the temperature of the first annealing and/or the second annealing is 500 to 850° C.

5. The manufacturing method for producing a semiconductor device as claimed in claim 1, wherein the implantation dosage for implanted ions is $1\times10^{14}$ cm$^{-2}$ to $1\times10^{16}$ cm$^{-2}$.

6. The manufacturing method for fabricating a semiconductor device as claimed in claim 1, wherein the thickness of the deposited metal layer is less than or equal to 5 nm.

7. The manufacturing method for fabricating a semiconductor device as claimed in claim 1, wherein the material of the deposited metal layer comprises cobalt, nickel, nickel-platinum alloy, nickel-cobalt alloy or ternary alloy of nickel, platinum and cobalt.

8. The manufacturing method for fabricating a semiconductor device as claimed in claim 1, wherein the dummy gate structure is constituted by oxide.

9. The manufacturing method for fabricating a semiconductor device as claimed in claim 1, further comprising: after depositing the metal gate material, forming a metal contact structure in the interlayer dielectric layer, the metal contact structure being electrically connected to the epitaxially grown metal silicide.

10. The manufacturing method for fabricating a semiconductor device as claimed in claim 1, wherein the hydrofluoric acid wet etching is used for removing the dummy gate structure.

11. The manufacturing method for fabricating a semiconductor device as claimed in claim 1, wherein the substrate is a bulk silicon substrate or SOI substrate.

12. The manufacturing method for fabricating a semiconductor device as claimed in claim 8, wherein the oxide is silicon dioxide.

13. The manufacturing method for fabricating a semiconductor device as claimed in claim 9, wherein the metal contact structure comprises a contact hole buried layer and a filling metal layer.

* * * * *